United States Patent
Wang

(10) Patent No.: US 11,516,928 B2
(45) Date of Patent: Nov. 29, 2022

(54) ELECTRONIC DEVICE

(71) Applicant: BEIJING XIAOMI MOBILE SOFTWARE CO., LTD., Beijing (CN)

(72) Inventor: Lei Wang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 113 days.

(21) Appl. No.: 16/798,773

(22) Filed: Feb. 24, 2020

(65) Prior Publication Data

US 2021/0127508 A1 Apr. 29, 2021

(30) Foreign Application Priority Data

Oct. 23, 2019 (CN) .......................... 201911012213.5

(51) Int. Cl.
| | | |
|---|---|---|
| H05K 5/00 | (2006.01) | |
| H05K 5/02 | (2006.01) | |
| H05K 5/04 | (2006.01) | |
| G03B 17/02 | (2021.01) | |
| G03B 17/48 | (2021.01) | |

(Continued)

(52) U.S. Cl.
CPC .......... *H05K 5/0021* (2013.01); *G03B 17/02* (2013.01); *G03B 17/48* (2013.01); *H04R 1/028* (2013.01); *H05K 5/0017* (2013.01); *H05K 5/0086* (2013.01); *H05K 5/0217* (2013.01); *H05K 5/0247* (2013.01); *H05K 5/04* (2013.01); *H04R 2499/11* (2013.01); *H04R 2499/15* (2013.01);

(Continued)

(58) Field of Classification Search
CPC ...................................................... G06F 1/166
See application file for complete search history.

(56) References Cited

U.S. PATENT DOCUMENTS

2008/0228982 A1 9/2008 Kimchi et al.
2011/0280653 A1* 11/2011 Sjostedt .............. H01R 13/187
29/521

(Continued)

FOREIGN PATENT DOCUMENTS

| CN | 2932854 Y | 8/2007 |
|---|---|---|
| CN | 103503161 A | 1/2014 |

(Continued)

OTHER PUBLICATIONS

Extended European search report of counterpart EP application No. 20161734.7 dated Oct. 15, 2020.

(Continued)

*Primary Examiner* — Jerry Wu
(74) *Attorney, Agent, or Firm* — Syncoda LLC; Feng Ma

(57) ABSTRACT

An electronic device includes at least two modules, each module includes at least one component; two adjacent modules of the at least two modules are detachably connected, and the two adjacent modules are electrically connected; the housings of the at least two modules are connected to form the housing of the electronic device; in the at least two modules, the first module includes a mainboard and the second module includes a battery. When any module in the electronic device needs to be updated, the module only needs to be detached from the electronic device, and then the replacement of the module is connected to other modules, thereby forming a new electronic device. There is no need to replace the entire electronic device, and the hardware cost is reduced.

7 Claims, 7 Drawing Sheets

(51) Int. Cl.
*H04R 1/02* (2006.01)
*H04W 4/80* (2018.01)
*H04W 84/04* (2009.01)
*H04W 84/12* (2009.01)

(52) U.S. Cl.
CPC ............ *H04W 4/80* (2018.02); *H04W 84/042* (2013.01); *H04W 84/12* (2013.01)

(56) References Cited

U.S. PATENT DOCUMENTS

| | | | |
|---|---|---|---|
| 2014/0293553 A1 | 10/2014 | Stanelli et al. | |
| 2015/0036273 A1* | 2/2015 | Hui ..................... | G06F 1/1654 361/679.08 |
| 2016/0056649 A1 | 2/2016 | Chen | |
| 2017/0351347 A1 | 12/2017 | Yamada | |

FOREIGN PATENT DOCUMENTS

| | | |
|---|---|---|
| CN | 203466401 U | 3/2014 |
| CN | 204304081 U | 4/2015 |
| CN | 205944573 U | 2/2017 |
| CN | 106658272 A | 5/2017 |
| CN | 208335057 U | 1/2019 |
| CN | 109688252 A | 4/2019 |
| JP | 2011238393 A | 11/2011 |
| WO | 2016183262 A1 | 11/2016 |
| WO | 2019092591 A1 | 5/2019 |

OTHER PUBLICATIONS

First office action of Chinese application No. 201911012213.5 dated Feb. 9, 2022.
China National Intellectual Property Administration, Second office action of Chinese application No. 201911012213.5 dated Jul. 13, 2022, which is foreign counterpart application of this US application.

* cited by examiner

ELECTRONIC DEVICE

CROSS-REFERENCE TO RELATED APPLICATION

This application claims priority to Chinese Patent Application 201911012213.5 filed on Oct. 23, 2019, the disclosure of which is hereby incorporated by reference in its entirety.

BACKGROUND

At present, the use of electronic devices is widespread. As users demand ever more functions of the electronic devices, the update speed of various components in the electronic devices is becoming faster, and the performances of the electronic devices are also constantly improved.

SUMMARY

The present disclosure relates generally to the field of electronic technologies, and more specifically to an electronic device.

Various embodiments of the present disclosure provide an electronic device.

In an aspect, the electronic device includes at least two modules, and each module includes at least one component; two adjacent modules of the at least two modules are detachably connected, and the two adjacent modules are electrically connected;

the housings of the at least two modules are connected to form a housing of the electronic device; and in the at least two modules, the first module includes a mainboard and the second module includes a battery.

It should be understood that the above general description and the detailed description below are merely used to explain the present disclosure, and cannot be construed as a limitation to the present disclosure.

BRIEF DESCRIPTION OF THE DRAWINGS

The accompanying drawings herein are incorporated in and constitute a part of the description, illustrate the embodiments consistent with the present disclosure, and serve to explain the principles of the present disclosure together with the description.

Figure 1:
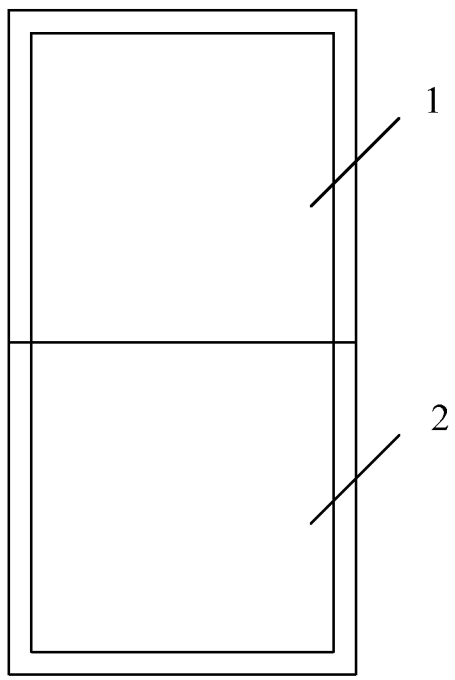
FIG. 1 is a schematic structural diagram of an electronic device according to some embodiments.

The reference signs of the parts in the drawings are explained as follows:

1—first module; 2—second module; 3—groove slide rail; 4—convex slot slide rail; 5—male connector; 6—female connector; 7—third module; 8—camera; 9—fourth module; 31—elastic piece; 41—clamping slot.

DETAILED DESCRIPTION

In order to describe the technical solutions in some embodiments of the present disclosure clearly and completely, the accompanying drawings are referred to. Apparently, the described embodiments are some embodiments, rather than all embodiments, of the present disclosure. Based on the embodiments of the present disclosure, all other embodiments derived by a person of ordinary skill in the art without creative efforts shall fall within the protection scope of the present disclosure.

Descriptions will now be made in detail with respect to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. In contrast, they are merely examples of apparatuses and methods consistent with aspects related to the disclosure as recited in the appended claims.

A typical electronic device includes a mainboard, a battery, a loudspeaker and other components. The mainboard, the battery, the loudspeaker and other components in the electronic device are an integrated structure. If a single component in the electronic device needs to be upgraded, or the user needs to configure the electronic device according to one's own needs or preferences, such as a high-end electronic device, a mid-end electronic device or a low-end electronic device, the user needs to replace a certain component of the electronic device, it is necessary to replace the entire electronic device, which makes the hardware cost relatively high.

Various embodiments of the present disclosure can overcome the problems of the conventional devices that if the user needs to replace a certain component of the electronic device, the entire electronic device needs to be replaced, which makes the hardware cost relatively high FIG. 1 is a schematic structural diagram of an electronic device according to some embodiments.

The electronic device can be a mobile phone, a tablet computer, a personal computer, or the like. The electronic device includes various components, for example, the component can include a camera, a mainboard, a loudspeaker, a battery, a display screen, and the like.

Referring to FIG. 1, the electronic device includes: at least two modules, and each module includes at least one component. Two adjacent modules of the at least two modules are detachably connected, and the two adjacent modules are electrically connected. When two adjacent modules of the at least two modules are detachably connected and electrically connected, the housings of the at least two modules are connected to form the housing of the electronic device together. At this point, the at least two modules can form the electronic device, and the electronic device can work normally.

In some embodiments, the housing of each of the at least two modules is a metal housing, or a plastic housing, or a housing of other materials.

When the housing of each of the at least two modules is the metal housing, the housings of the at least two modules are connected to form the housing of the electronic device. The metal housing can provide protection for the electronic device, which prevent the damage to the electronic device caused by external forces.

Moreover, in the at least two modules, the first module 1 includes a mainboard and the second module 2 includes a battery. The mainboard of the electronic device can be a PCB (printed circuit board) or other types of circuit boards, and the battery can be a lithium battery or other types of batteries. The mainboard is connected to multiple components to enable each component to work. The battery is a power source for the electronic device and provides power for various components in the electronic device.

The mainboard and the battery in the electronic device play an important role in the normal operation of the electronic device. If the mainboard or the battery of the electronic device needs to be replaced, only the module where the mainboard or the battery is located needs to be detached from the electronic device and replaced with a new module, thereby realizing the replacement of the module.

In some embodiments of the present disclosure, the module containing the battery further comprises other components, such as a housing that forms part of the housing of the electronic device, battery interface, battery controller, charging controller, etc. That way, when replacing the module containing the battery, other components in the module are replaced together and conveniently by the user.

For example, when any module in the electronic device has a fault, or when any device in any module has a fault, or when the user needs to improve the performances of any component in the electronic device, the corresponding module can be detached, and then the replacement module is connected to other modules of the electronic device, thereby realizing the replacement of the module.

The electronic device provided by various embodiments of the present disclosure can include at least two modules, each module includes at least one component; two adjacent modules of the at least two modules are detachably connected, and the two adjacent modules are electrically connected, the housings of the at least two modules can be connected to form the housing of the electronic device, in the at least two modules, the first module of includes the mainboard and the second module includes the battery. When any module in the electronic device needs to be updated, the module only needs to be detached from the electronic device, and then the replacement of the module is connected to other modules, thereby forming a new electronic device. There is no need to replace the entire electronic device, and the hardware cost is reduced.

Because a conventional electronic device is typically an integrated structure, if the user needs to replace or upgrade any component in the electronic device, a professional technician needs to be found to disassemble the electronic device and then replace the component that needs to be replaced, the electronic device is assembled after the replacement, in which the operation is cumbersome and inefficient.

Various embodiments of the present disclosure provide an electronic device with a new structure that makes the possibility for the user to replace the component of the electronic device by oneself, the user can replace any module in the electronic device by oneself, in which the operation is simple and convenient, and the operating efficiency is high. In addition, the user can also choose freely configured components and assemble the electronic devices with different configurations by oneself, which improves the user's selectivity and makes the electronic device diversification.

Figure 2:
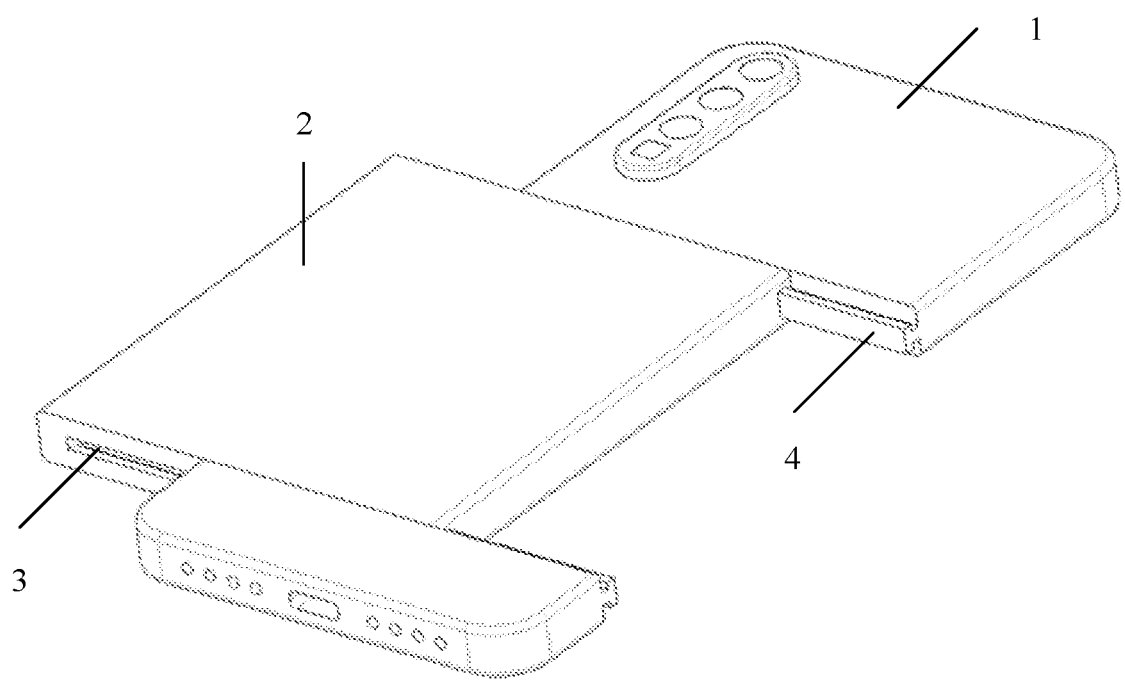
FIG. 2 is a schematic structural diagram of a slide rail of an electronic device according to some embodiments.

In some embodiments, as shown in FIG. 2, for two adjacent modules of the at least two modules included in the electronic device, one module of the two adjacent modules is provided with a groove slide rail 3, the other module is provided with a convex slot slide rail 4, and the groove slide rail 3 can be engaged with the convex slot slide rail 4.

When the groove slide rail 3 is engaged with the convex slot slide rail 4, that is, two adjacent modules of the electronic device are detachably connected and electrically connected, and the groove slide rail 3 and the convex slot slide rail 4 can also be separated, that is, the first module and the second module of the electronic device can be separated.

In some embodiments, when the two adjacent modules are not connected, the convex slot slide rail 4 is inserted into the groove slide rail 3, and is engaged with the groove slide rail 3 to connect the two modules.

For example, one end of the convex slot slide rail 4 slides in from one end of the groove slide rail 3, and when reaching the other end of the groove slide rail 3, the convex slot slide rail 4 is fully engaged with the groove slide rail 3 to ensure the connection of two adjacent modules.

In some other embodiments, when two adjacent modules of the at least two modules are connected, the groove slide rail 3 of one module is engaged with the convex slot slide rail 4 of the other module. At this point, the convex slot slide rail 4 can slide out from one end of the groove slide rail 3 and be separated from the groove slide rail 3 so as to separate the two modules.

For example, when the convex slot slide rail 4 and the groove slide rail 3 are completely coincided, one end of the convex slot slide rail 4 starts to slide out from one end of the groove slide rail 3 to the other end. When one end of the convex slot slide rail 4 reaches the other end of the groove slide rail 3, the convex slot slide rail 4 is completely separated from the groove slide rail 3, that is, two adjacent modules are separated.

It should be noted that, for any module in the electronic device, the module can have one or more adjacent modules. If the module has only one adjacent module, the module is provided with a slide rail on one side opposite to the adjacent module, and the slide rail is matched with the slide rail of the adjacent module. For example, when one side of a module is provided with the convex slot slide rail, one side of a module adjacent to the module is provided with a groove slide rail.

If the module has multiple adjacent modules, the slide rails are disposed on the sides of the module opposite to the multiple adjacent modules, and each slide rail is matched with the slide rail of the adjacent module.

Figure 3:
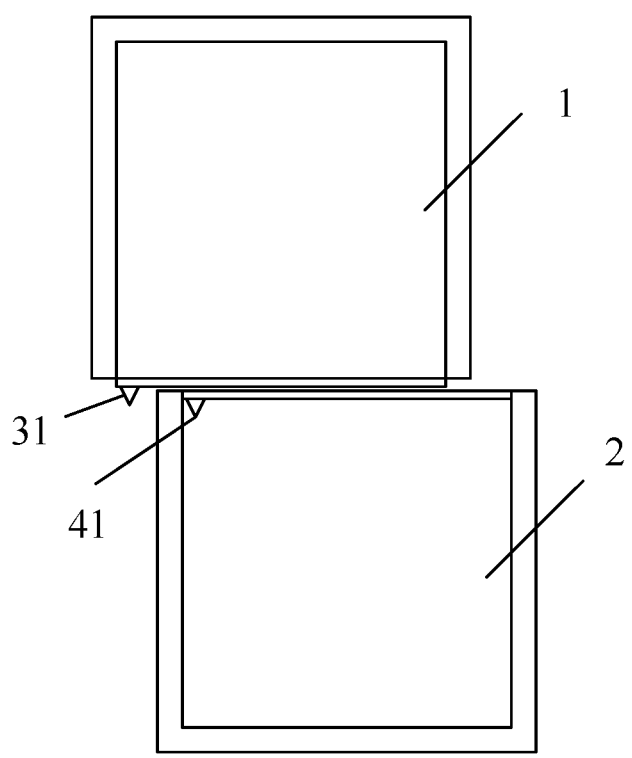
FIG. 3 is a schematic structural diagram of an elastic piece and a clamping slot of an electronic device according to some embodiments.

In some embodiments, as shown in FIG. 3, in the two adjacent modules, the first end of the convex slot slide rail 4 of one module is provided with an elastic piece 31, and the first end of the groove slide rail 3 of the other module is provided with a clamping slot 41 matched with the elastic piece 31. When the first end of the convex slot slide rail 4 completely slides into the groove slide rail 3 from the second end of the groove slide rail 3, the elastic piece 31 on the convex slot slide rail 4 is engaged with the clamping slot 41 on the groove slide rail 3, and the convex slot slide rail 4 is engaged with the groove slide rail 3 to connect the two modules.

The shape of the elastic piece 31 and the shape of the clamping slot 41 are the same, and the size of the elastic piece 31 and the size of the clamping slot 41 are the same. Or, the size of the clamping slot 41 is larger than the size of the elastic piece 31, so that the clamping slot 41 can accommodate the elastic piece 31.

In some other embodiments, an accommodating slot is disposed in the first end of the convex slot slide rail 4, and the outer surface of one side of the accommodating slot is provided with the elastic piece 31 matched with the accommodating slot. The elastic piece 31 can be retracted into the accommodating slot.

For example, when the convex slot slide rail 4 starts to be inserted from the second end of the groove slide rail 3 until the groove slide rail 3 moves to the elastic piece 31 of the convex slot slide rail 4, the elastic piece 31 is subjected to the pressure of the groove slide rail 3 and is thus retracted into the accommodating slot of the convex slot slide rail 4. When the clamping slot 41 of the groove slide rail 3 moves to the position of the elastic piece 31 of the convex slot slide rail 4, the elastic piece 31 is no longer subjected to the pressure of the groove slide rail 3, pops out from the accommodating slot, and is engaged with the clamping slot 41 of the groove slide rail 3.

In some other embodiments, a detaching button is disposed at the first end of the convex slot slide rail 4, the detaching button is located on the housing of the electronic device, and the detaching button is connected to the elastic piece 31 by a connecting rod. The detaching button is configured to drag the elastic piece when being pressed so as to retract the connected elastic piece 31 to the accommodating slot. The detaching button is also configured to move the elastic piece out of the accommodating slot when springing up.

When needing to separate the groove slide rail 3 from the convex slot slide rail 4, the user presses the detaching button, the elastic piece 31 in the convex slot slide rail 4 is retracted into the accommodating slot, and the elastic piece 31 is no longer engaged with the clamping slot 41 in the groove slide rail 3. At this point, the convex slot slide rail 4 can be slid out from one end of the groove slide rail 3 and separated from the groove slide rail 3 so as to separate the two adjacent modules. When the user needs to connect the groove slide rail 3 to the convex slot slide rail 4, the groove slide rail 3 and the convex slot slide rail 4 are completely coincided, thereafter, the detaching button is popped up, and then the elastic piece 31 in the convex slot slide rail 4 is moved out of the accommodating slot and inserted into the clamping slot of the groove slide rail 3, so that the elastic piece 31 is engaged with the clamping slot of the groove slide rail 3, and further the two adjacent modules are connected.

In some other embodiments, the elastic piece 31 on the convex slot slide rail 4 has elasticity, when the user needs to separate the groove slide rail 3 from the convex slot slide rail 4, opposite forces are applied to the groove slide rail 3 and the convex slot slide rail 4 respectively, then the elastic piece 31 on the convex slot slide rail 4 is subjected to the pressure and retracted into the accommodating slot, the elastic piece 31 is no longer engaged with the clamping slot 41 in the groove slide rail 3, the convex slot slide rail 4 can slide out from one side of the groove slide rail 3 and be separated from the groove slide rail 3, so that the two adjacent modules are separated.

It should be noted that some embodiments of the present disclosure are only described by using the fact that the elastic piece 31 is disposed on the convex slot slide rail 4 and the clamping slot 41 is disposed in the groove slide rail 3 as an example. In another embodiment, the elastic piece 31 can also be disposed on the first end of the groove slide rail 3, the clamping slot 41 matched with the elastic piece 31 can be disposed on the first end of the convex slot slide rail 4, and the working process of the elastic piece 31 and the clamping slot 41 is similar to the above embodiment, and is not repeated here.

In some embodiments of the present disclosure, the elastic piece 31 is disposed in the convex slot slide rail 4, and the clamping slot 41 matched with the elastic piece 31 is disposed in the groove slide rail 3. By the engagement between the elastic piece 31 and the clamping slot 41, the groove slide rail 3 and the convex slot slide rail 4 can be engaged, and further the two adjacent modules are fixedly connected, thereby enhancing the connecting reliability of the two adjacent modules and preventing the two adjacent modules from separation.

In some embodiments, a first electrical contact and a second electrical contact are disposed on the inner side of the convex slot slide rail 4 and the inner side of the groove slide rail 3 respectively. When the convex slot slide rail 4 is engaged with the groove slide rail 3, the first electrical contact and the second electrical contact are electrically connected, so that the component connected to the first electrical contact and the component connected to the second electrical contact are electrically connected.

As the at least two modules included in the electronic device are independent modules, if each of the at least two modules needs to work, each module needs to be electrically connected. Therefore, the electrical contact is disposed in each module. When the at least two modules in the electronic device are connected, the electrical contact in each module is also electrically connected to the electrical contact of the adjacent module.

It should be noted that when the groove slide rail 3 and the convex slot slide rail 4 are completely coincided, the first electrical contact and the second electrical contact may be connected to each other, and the positions of the first electrical contact and the second electrical contact are not restricted.

In some other embodiments, the first electrical contact is located at the position of the first end of the convex slot slide rail 4 connected to the groove slide rail 3, and the second electrical contact is located at the position of the first end of the groove slide rail 3 connected to the convex slot slide rail 4.

When the groove slide rail 3 and the convex slot slide rail 4 are completely coincided, the first end of the convex slot slide rail 4 is connected to the first end of the groove slide rail 3. The first electrical contact is located at the position of the first end of the convex slot slide rail 4 connected to the groove slide rail 3, and the second electrical contact is located at the position of the first end of the groove slide rail 3 connected to the convex slot slide rail 4, so when the first end of the convex slot slide rail 4 is connected to the first end of the groove slide rail 3, the tight connection between the first electrical contact and the second electrical contact can be ensured.

Figure 4:
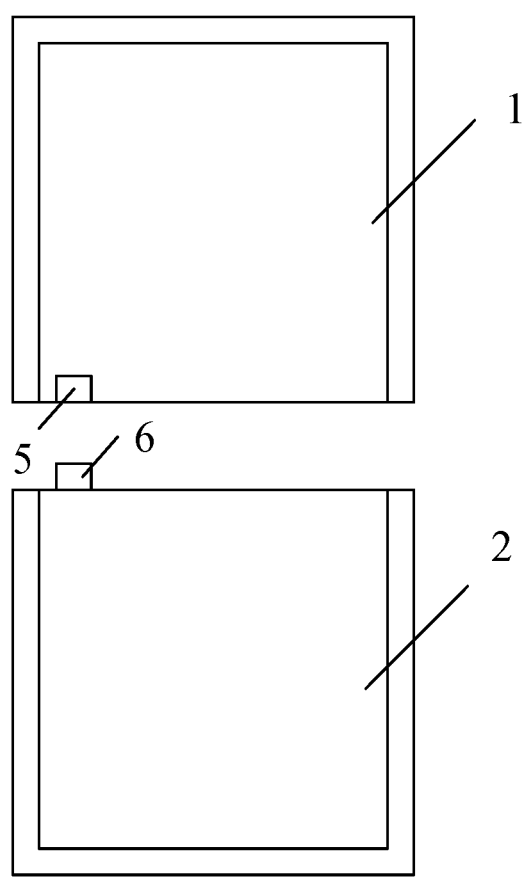
FIG. 4 is a schematic structural diagram of an electronic device according to some embodiments.

In some embodiments, as shown in FIG. 4, the electronic device includes at least two modules, one of the two adjacent modules of the at least two modules is provided with a male connector 5, and the other module is provided with a female connector 6. The male connector 5 is inserted into the female connector 6, and the male connector 5 and the female connector 6 are electrically connected, so that the component connected to the male connector 5 and the component connected to the female connector 6 are electrically connected.

When the male connector 5 is inserted into the female connector 6, the male connector 5 and the female connector 6 are respectively provided with the elastic piece and the clamping slot therein, and the working process of the elastic piece and the clamping slot is the same as the that of the elastic piece and the clamping slot of the above embodiment and is not repeated here.

In some embodiments of the present disclosure, the elastic piece and the clamping slot are disposed in the male connector 5 and the female connector 6. When the male connector 5 and the female connector 6 are connected, the elastic piece is engaged with the clamping slot to fix the two adjacent modules, and to prevent the two modules from being separated which leads to the disconnection between the two adjacent modules.

In some embodiments, the third module 7 of the at least two modules of the electronic device includes a camera 8. The camera 8 can be configured for shooting.

When the electronic device includes the first module 1, the second module 2 and the third module 7, the first module 1, the second module 2 and the third module 7 are connected by adopting the above detachable manner, and two adjacent modules are electrically connected.

In some other embodiments, the third module 7 is located on the upper side, the first module 1 and the second module 2 are both located on the lower side of the third module 7, and the first module 1 can be located on the upper side of the second module 2 or the lower side of the second module 2.

Figure 5:
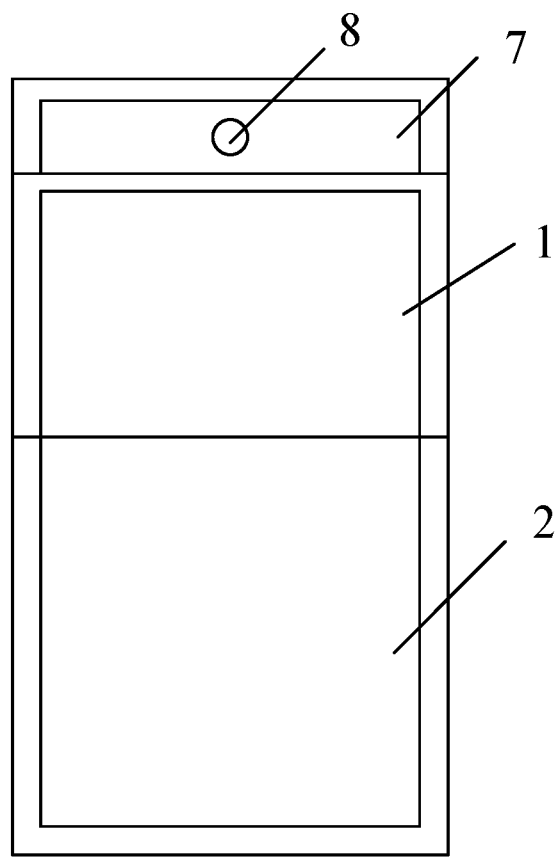
FIG. 5 is a schematic structural diagram of an electronic device according to some embodiments.

As shown in FIG. 5, the third module 7, the first module 1, and the second module 2 are connected in the manner of the upper side, the middle side, and the lower side. Or, the first module 1, the second module 2, and the third module 7 can also be connected in other manners.

Figure 6:
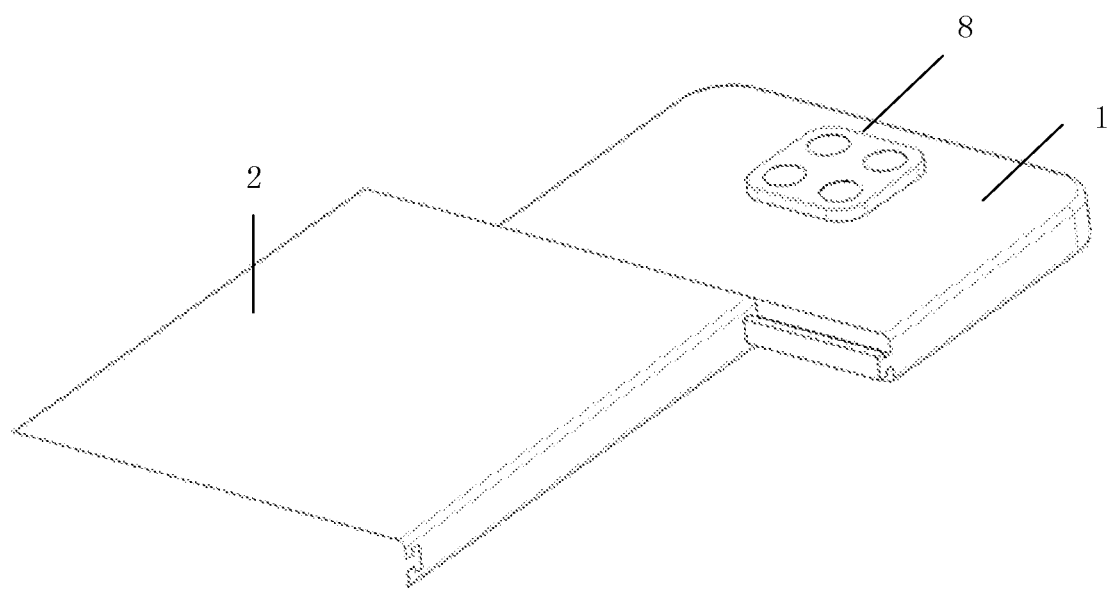
FIG. 6 is a schematic structural diagram of an electronic device according to some embodiments.

In some embodiments, as shown in FIG. 6, the first module 1 of the electronic device further includes a camera 8. Therefore, the first module 1 includes both the mainboard and the camera 8. When the camera 8 in the electronic device needs to be replaced, only the first module 1 where the camera 8 is located needs to be replaced, and there is no need to replace the entire electronic device.

In some other embodiments, the first module 1 is located on the upper side of the second module 2, so as to ensure that the camera 8 in the first module 1 is located on the upper side of the electronic device, which is convenient for the camera 8 to take a picture or a video.

In some embodiments, the fourth module 9 of the at least two modules of the electronic device includes a loudspeaker. The loudspeaker is configured to play sound.

When the electronic device includes the first module 1, the second module 2 and the fourth module 9, the first module 1, the second module 2 and the fourth module 9 are connected by adopting the above detachable manner, and two adjacent modules are electrically connected.

In some other embodiments, the first module 1 and the second module 2 are both located on the upper side of the fourth module 9, and the first module 1 can be located on the upper side of the second module 2 or the lower side of the second module 2.

In some embodiments of the present disclosure, by disposing the fourth module 9 on the lowermost side, it can be ensured that the loudspeaker in the fourth module 9 is not obstructed when emitting sound, thereby ensuring the clarity of the sound.

Figure 7:
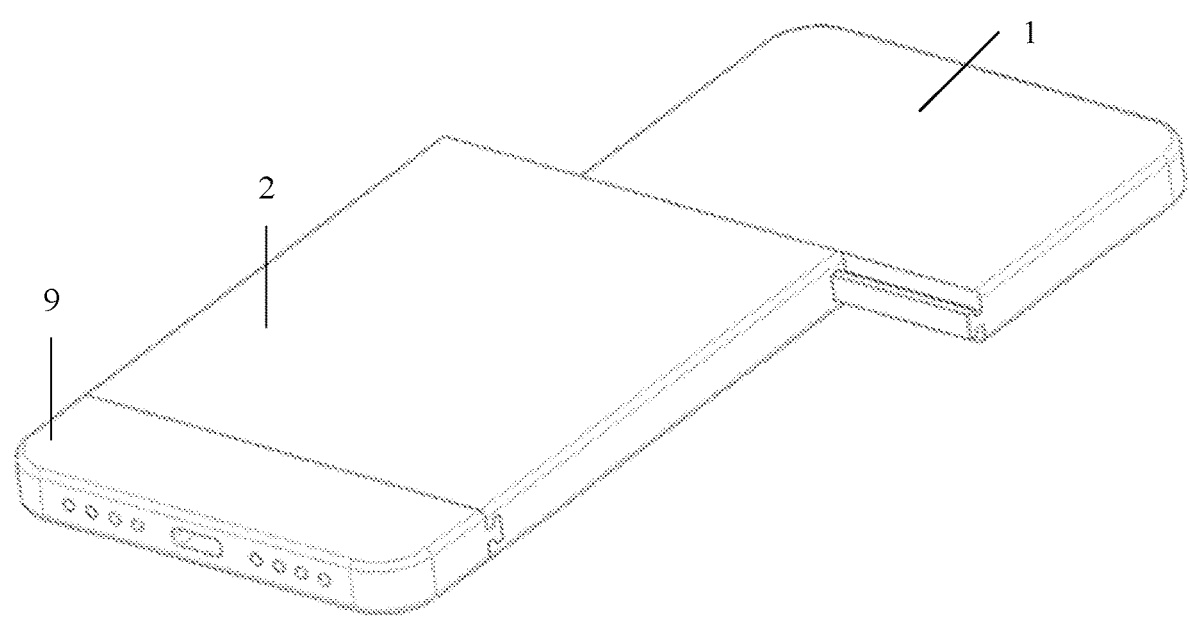
FIG. 7 is a schematic structural diagram of an electronic device according to some embodiments.

As shown in FIG. 7, the first module 1, the second module 2, and the fourth module 9 are connected in the manner of the upper side, the middle side, and the lower side. Or, the first module 1, the second module 2, and the fourth module 9 are connected in other manners.

In some embodiments, the fifth module of the at least two modules of the electronic device includes a display screen. The display screen is configured to display an image.

When the electronic device includes the first module 1, the second module 2 and the fifth module, the first module 1, the second module 2, and the fifth module are connected by adopting the above detachable manner, and two adjacent modules are electrically connected.

In some other embodiments, the fifth module is located on the outer surfaces of the first module 1 and the second module 2, so as to ensure that the display screen in the fifth module can display the image normally.

It should be noted that at least two modules of the electronic device in some embodiments of the present disclosure may include at least one of the third module 7, the fourth module 9, and the fifth module. At least one of the third module 7, the fourth module 9 and the fifth module forms the electronic device together with the first module 1 and the second module 2.

In some embodiments, the electronic device includes at least two modules, and the display screen is provided on the upper side of each of the at least two modules. When the housings of the at least two modules are connected, the display screens in the at least two modules form the display screen of the electronic device.

The electronic device includes at least two modules, the at least two modules are independent modules, and each module of the at least two modules is provided with the display screen, therefore, when the at least two modules are connected, the display screens on all the modules are also connected to form the display screen of the electronic device.

In some embodiments, the display screens on the at least two modules in the electronic device are full screen, so as to ensure that when the at least two modules of the electronic device are connected, the display screens of the at least two modules form one display screen, and there is no gap at the position where the display screens are connected, thereby improving the aesthetics of the display screen.

In some embodiments, each of the at least two modules of the electronic device is provided with a wireless transmission module therein, and the at least two modules perform signal transmission by the wireless transmission module.

In some embodiments, the wireless transmission module includes at least one of a ZigBee module, a Bluetooth module, a Wi-Fi module, and a 5G module.

In some implementations, one of the two adjacent modules is provided with a groove slide rail, and the other module is provided with a convex slot slide rail;

the convex slot slide rail is inserted into the groove slide rail, and is engaged with the groove slide rail, so that the two adjacent modules are connected;

or, the convex slot slide rail slides out from one end of the groove slide rail and is separated from the groove slide rail to separate the two adjacent modules.

In some other implementations, the first end of the groove slide rail is provided with an elastic piece, and the first end of the convex slot slide rail is provided a clamping slot matched with the elastic piece; and the convex slot slide rail is inserted into the groove slide rail from the second end of the groove slide rail, and when the elastic piece is engaged with the clamping slot, the convex slot slide rail is engaged with the groove slide rail.

In some other implementations, an accommodating slot is disposed in the first end of the groove slide rail, the elastic piece is disposed in the outer surface of one side of the accommodating slot, and the accommodating slot is configured to accommodate the elastic piece.

In some other implementations, the first end of the groove slide rail is provided with a detaching button, the detaching button is located on the housing of the electronic device, the detaching button is connected to the elastic piece by a connecting rod, and the detaching button is configured to drag the elastic piece when being pressed so as to retract the elastic piece to the accommodating slot; and the detaching button is also configured to move the elastic piece out of the accommodating slot when springing up.

In some other implementations, a first electrical contact and a second electrical contact are disposed on the inner side of the convex slot slide rail and the inner side of the groove slide rail respectively; and when the convex slot slide rail is engaged with the groove slide rail, the first electrical contact and the second electrical contact are electrically connected, so that the component connected to the first electrical contact and the component connected to the second electrical contact are electrically connected.

In some other implementations, one of the two adjacent modules is provided with a male connector, and the other module is provided with a female connector; and the male connector is inserted into the female connector, and the male connector and the female connector are electrically connected, so that the component connected to the male connector and the component connected to the female connector are electrically connected.

In some other implementations, the third module of the at least two modules includes a camera.

In some other implementations, the fourth module of the at least two modules includes a loudspeaker.

In some other implementations, the fifth module of the at least two modules includes a display screen.

In some other implementations, a display screen is disposed on the upper side of each of the at least two modules; and when the housings of the at least two modules are connected, the display screens in the at least two modules form the display screen of the electronic device.

In some other implementations, each of the at least two modules is provided with a wireless transmission module therein, and the wireless transmission module is configured for signal transmission.

In some other implementations, the wireless transmission module includes at least one of a ZigBee module, a Bluetooth module, a Wi-Fi (wireless fidelity) module, and a 5G (fifth generation mobile communication technology) module.

The electronic device provided by some embodiments of the present disclosure includes at least two modules, each module includes at least one component, two adjacent modules of the at least two modules are detachably connected, and the two adjacent modules are electrically connected, the housings of the at least two modules can be connected to form the housing of the electronic device, in the at least two modules, the first module includes the mainboard and the second module includes the battery. When any module in the electronic device needs to be updated, the module only needs to be detached from the electronic device, and then the replacement of the module is connected to other modules, thereby forming a new electronic device. There is no need to replace the entire electronic device, and the hardware cost is reduced.

In addition, some embodiments of the present disclosure provide an electronic device with a new structure, which provides the possibility for the user to replace the component of the electronic device by oneself. The user can replace any module in the electronic device by oneself, the operation is simple and convenient, the operating efficiency is high. Further, the user can also choose freely configured components and assemble the electronic devices with different configurations by oneself, which improves the user's selectivity and makes the electronic device diversification.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

The above description includes part of embodiments of the present disclosure, and not limits the present disclosure. Any modifications, equivalent substitutions, improvements, etc., within the spirit and principles of the present disclosure, are included in the scope of protection of the present disclosure.

It is apparent that those of ordinary skill in the art can make various modifications and variations to the embodiments of the disclosure without departing from the spirit and scope of the disclosure. Thus, it is intended that the present disclosure cover the modifications and the modifications.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion within a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, or the device including the element.

Specific examples are used herein to describe the principles and implementations of some embodiments. The description is only used to help convey understanding of the possible methods and concepts. Meanwhile, those of ordinary skill in the art can change the specific manners of implementation and application thereof without departing from the spirit of the disclosure. The contents of this specification therefore should not be construed as limiting the disclosure.

For example, in the description of the present disclosure, the terms "some embodiments," or "example," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In the descriptions, with respect to circuit(s), unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc. is employed, or it is expressly stated that a plurality of units, devices or components, etc. are employed, the circuit(s), unit(s), device(s), component(s), etc. can be singular, or plural.

Based on various embodiments of the present disclosure, the disclosed apparatuses, devices, and methods can be implemented in other manners. For example, the abovementioned devices can employ various methods of use or implementation as disclosed herein.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

Dividing the device into different "regions," "units," "components" or "layers," etc. merely reflect various logical functions according to some embodiments, and actual implementations can have other divisions of "regions," "units," "components" or "layers" etc. realizing similar functions as described above, or without divisions. For example, multiple regions, units, or layers, etc. can be combined or can be integrated into another system. In addition, some features can be omitted, and some steps in the methods can be skipped.

Those of ordinary skill in the art will appreciate that the units, components, regions, or layers, etc. in the devices provided by various embodiments described above can be provided in the one or more devices described above. They can also be located in one or multiple devices that is (are) different from the example embodiments described above or illustrated in the accompanying drawings. For example, the units, regions, or layers, etc. in various embodiments described above can be integrated into one module or divided into several sub-modules.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms.

In the present disclosure, it is to be understood that the terms "lower," "upper," "center," "longitudinal," "transverse," "length," "width," "thickness," "upper," "lower," "front," "back," "left," "right," "vertical," "horizontal," "top," "bottom," "inside," "outside," "clockwise," "counter-clockwise," "axial," "radial," "circumferential," "column," "row," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to the disclosed aspects of the exemplary embodiments can be made in addition to those described above by a person of ordinary skill in the art having the benefit of the present disclosure without departing from the spirit and scope of the disclosure contemplated by this disclosure and as defined in the following claims. As such, the scope of this disclosure is to be accorded the broadest reasonable interpretation so as to encompass such modifications and equivalent structures.

Other embodiments of the present disclosure will be apparent to those skilled in the art from consideration of the specification and practice of the technical solution disclosed here. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

The invention claimed is:

1. An electronic device, comprising a first module and a second module, wherein
    the first module and the second module are detachably coupled mechanically and electrically;
    the first module comprises a mainboard and is provided with a first housing and a first display screen; and the second module comprises a battery and is provided with a second housing and a second display screen; the first and second display screens are surrounded by a plurality of side walls;
    wherein the second module is provided with a groove slide rail along a first side wall of the plurality of side walls, and the first module is provided with a convex slot slide rail along a first side wall of the plurality of side walls, the convex slot slide rail is I-shaped in a cross section view along the first side wall; wherein, in a first position, the convex slot slide rail is inserted into the groove slide rail from an end of the groove slide rail and is engaged with the groove slide rail to connect the first module and the second module; in a second position, the convex slot slide rail slides out from the end of the groove slide rail and is separated from the groove slide rail to separate the first module and the second module; wherein
    the convex slot slide rail is provided with an elastic piece, and the groove slide rail is provided a clamping slot with a triangle shape matched with a same shape of the elastic piece; and when the convex slot slide rail is inserted into the groove slide rail from the end of the groove slide rail, the elastic piece is engaged with the clamping slot, such that the convex slot slide rail is engaged with the groove slide rail; a first electrical contact is disposed on an inner side of the convex slot slide rail and a second electrical contact is disposed on an inner side of the groove slide rail; and
    in a case that the first module and the second module are connected, the first housing and the second housing are connected and the first electrical contact and the second electrical contact are electrically connected to form a housing of the electronic device, the first display screen and the second display screen are connected to form a display screen of the electronic device, and the first display screen and the second display screen are fixed on a same plane;
    the electronic device further comprises a third module and a fourth module, wherein the third module comprises a camera, a side rail of the third module being detachably coupled to another side rail of the first module or to the second module mechanically and electrically; and the fourth module comprises a loudspeaker, a side rail of the fourth module being detachably coupled to another side rail of the first module, the second module, or the third module mechanically and electrically.

2. The electronic device according to claim 1, wherein the first module comprises a camera.

3. The electronic device according to claim 2, wherein the first module is located on the upper side of the second module.

4. The electronic device according to claim 1, wherein both the first module and the second module are provided with a wireless transmission module therein, and the wireless transmission module is configured for signal transmission.

5. The electronic device according to claim 1, wherein both the first housing and the second housing are made of metal.

6. The electronic device according to claim 1, wherein the mainboard is a Printed Circuit Board (PCB), and the battery is a lithium battery.

7. The electronic device according to claim 1, wherein
    both the first module and the second module are user-configurable, such that any module is replaceable by being detached from the electronic device, and then a replacement module is connected to other modules, thereby forming a new electronic device without replacing the entire electronic device; and
    the second module further comprises a battery housing that forms the housing of the electronic device, and a battery controller.

* * * * *